United States Patent [19]
Weil et al.
[11] Patent Number: 4,687,698
[45] Date of Patent: Aug. 18, 1987

[54] CORROSION PROTECTIVE PRINTING CYLINDER MAKEREADY

[75] Inventors: David M. Weil; Burton E. Lieberman, both of Chicago; Ronald F. Adams, Tinley Park, all of Ill.
[73] Assignee: The Cromwell Paper Company, Chicago, Ill.

[21] Appl. No.: 685,789
[22] Filed: Dec. 24, 1984
[51] Int. Cl.[4] .......................... B32B 3/14; B32B 5/16; B41F 29/08; C23C 16/00
[52] U.S. Cl. .................................. 428/209; 428/211; 428/537.5; 428/543; 428/909; 428/464; 427/248.1; 427/326; 101/415.1; 252/387; 252/394
[58] Field of Search ..................... 428/543, 909, 537.5, 428/211, 209; 427/326, 248.1; 101/415.1

[56] References Cited

U.S. PATENT DOCUMENTS

| | | | |
|---|---|---|---|
| 3,007,767 | 11/1961 | Le Bolt et al. | 428/211 |
| 3,936,560 | 2/1976 | Santurri et al. | 428/476.9 |
| 4,557,966 | 12/1985 | Weil | 428/211 X |

*Primary Examiner*—P. C. Ives
*Attorney, Agent, or Firm*—Charles W. Rummler

[57] ABSTRACT

An improved makeready packing for preventing corrosion of cylinders of offset or lithographic printing presses which comprises providing a cylinder surface contacting packing element having a corrosion inhibitor applied thereto in such a manner that the inhibitor will effectively protect the entire surface of the cylinder.

8 Claims, No Drawings

CORROSION PROTECTIVE PRINTING CYLINDER MAKEREADY

BACKGROUND OF THE INVENTION

For many years, the lithographic and offset printing industry has been plagued with the problem of keeping the polished surface of printing cylinders clean and free of corrosion of any kind, such problems arising so frequently that costly and time consuming press shutdown is necessary mainly to clean the cylinders and replace the deteriorated packing papers of the makeready in order to maintain the necessary high quality of the printed product.

Even spraying the cylinder with materials that would prevent spoiling of the polished cylinder or plate surface has been insufficient and for the past twenty or more years, various improvements have been make in the tympan or packing papers and makeready construction for this purpose, especially in the character and quality of the packing papers employed. To the present time, however, none has solved the problem of effectively preventing corrosion of the printing cylinder surfaces, particularly in the areas adjacent the ends of the cylinders which are exposed to the ambient environment, and it is the object of the present invention to provide a means for overcoming that problem.

SUMMARY OF THE INVENTION

The inventive concept involved in the herein disclosed invention is to provide a tympan paper or at least the cylinder contacting surface thereof with a suitable means for inhibiting surface corrosion of lithographic or offset printing cylinders. According to the present invention, this is accomplished by treating the tympan paper employed in the makeready assembly with a suitable corrosion inhibiting material or composition in such a manner that the inhibitor will directly engage the printing cylinder surface. It has been found that substantially any suitable corrosion inhibiting composition may be effectively employed for this purpose.

Also, it has been found that the corrosion inhibiting treatment of the cylinder contacting tympan or packing paper can be done in any convenient manner such as overall coating of the packing paper with a suitable corrosion inhibitor, or by applying a pattern of the inhibitor in any desired form on the packing papers, such as strips, dots, or substantially any form of spaced area design which will tend to minimize the quantity of the relatively expensive inhibiting material employed while still maintaining an effective corrosion inhibition on the surface of the printing cylinders.

As before mentioned, any suitable and effective corrosion inhibitor composition for ferrous or other metals may be employed, whether as a contact inhibitor or as a vapor phase inhibitor. A vapor phase type of corrosion inhibitor found to be satisfactory for this purpose consists of about fifteen parts urea, about fifteen parts sodium nitrite, about ten parts sodium benzoate, and about sixty parts of water, which when used with a loading factor of about 0.605 grams per square foot on the surface of at least the cylinder engaging paper sheet has been shown to produce cylinder protective results by production run printing cylinder tests.

A PREFERRED EMBODIMENT OF THE INVENTION

For commerical employment of the herein described invention, it is preferred that the corrosion inhibitor composition be substantially as before described, namely:

15 parts Urea,
15 parts Sodium Nitrite,
10 parts Sodium Benzoate, and
About 60 parts water as a carrier medium.

This material is applied to the makeready material in such a manner, whether as an overall coating or a printed pattern, that the total dried weight of the corrosion inhibitor per square foot of the cylinder contacting sheet surface will be in the neighborhood of about 0.605 grams per square foot.

It will be understood, however, that the applicants have no intention of limiting the invention to the particular embodiment above described and that any desired amount of inhibitor application to the tympan paper or makeready may be employed. Also, the loading of the inhibitor material on the cylinder contacting surface may be of any amount and applied in any desired fashion that will produce a suitable corrosion inhibiting protection for the printing cylinders onto which the treated makeready is applied.

Although this invention has been rather specifically described, it will be understood that the several factors comprising the practice of the invention may be varied or altered or omitted without departing from the spirit of the invention as defined by the following claims.

We claim:

1. A printing cylinder makeready packing element for an offset printing cylinder comprising a sheet of tympan material disposed for direct contact with the cylinder surface, said sheet having a ferrous metal corrosion inhibiting composition applied to its cylinder contacting surface.

2. A makeready tympan according to claim 1 wherein the tympan sheet has its cylinder engaging surface bearing a corrosion inhibiting material.

3. A makeready packing for a rotary printing cylinder according to claim 1 wherein the cylinder contacting tympan is treated with a corrosion inhibiting composition.

4. A makeready packing according to claim 1 wherein the corrosion inhibiting composition is a volative corrosion inhibitor.

5. The method of protecting the surface of an offset printing cylinder against corrosion which comprises treating the cylinder contacting surface of the makeready packing material with a ferrous metal corrosion inhibiting composition so that the cylinder contacting portion of the makeready will prevent cylinder surface corrosion.

6. The method of inhibiting surface corrosion of offset printing cylinders according to claim 5 which comprises treating the cylinder contacting surface tympan with a ferrous metal corrosion inhibiting composition.

7. The method of protecting the surface of an offset cylinder according to claim 5 wherein the makeready tympan is treated with a vapor phase corrosion inhibitor composition.

8. The method of inhibiting surface corrosion of offset printing cylinders according to claim 6 wherein the entire cylinder contacting surface of the makeready tympan is treated with a pattern of a vapor phase ferrous metal corrosion inhibitor applied as uniformly spaced printed areas of any predetermined size and shape.

* * * * *